(12) United States Patent
Datta et al.

(10) Patent No.: US 8,104,770 B2
(45) Date of Patent: Jan. 31, 2012

(54) SEMICONDUCTOR PROCESS CHAMBER

(75) Inventors: Amitava Datta, E. Greenwich, RI (US);
Peter G. Amos, Essex, CT (US);
Dominick G. More, Middletown, CT (US); Kenneth W. Cornett, Ivoryton, CT (US); Jeremy Payne, New Haven, CT (US)

(73) Assignee: Parker-Hannifin Corporation, Cleveland, OH (US)

( * ) Notice: Subject to any disclaimer, the term of this patent is extended or adjusted under 35 U.S.C. 154(b) by 835 days.

(21) Appl. No.: 12/024,187

(22) Filed: Feb. 1, 2008

(65) Prior Publication Data

US 2008/0187430 A1 Aug. 7, 2008

Related U.S. Application Data

(60) Provisional application No. 60/887,630, filed on Feb. 1, 2007, provisional application No. 60/908,217, filed on Mar. 27, 2007, provisional application No. 60/949,657, filed on Jul. 13, 2007.

(51) Int. Cl.
*F16J 15/10* (2006.01)

(52) U.S. Cl. ........ 277/346; 277/644; 277/650; 277/913; 277/939; 277/944; 414/939

(58) Field of Classification Search .................. 277/346, 277/913; 251/347
See application file for complete search history.

(56) References Cited

U.S. PATENT DOCUMENTS

| | | | |
|---|---|---|---|
| 3,248,119 A * | 4/1966 | Smith et al. | 277/637 |
| 3,375,016 A * | 3/1968 | Jellinek et al. | 277/645 |
| 3,765,647 A * | 10/1973 | Grove et al. | 251/317 |
| 4,029,294 A * | 6/1977 | McCaskill et al. | 251/282 |
| 4,053,085 A * | 10/1977 | Brown et al. | 220/378 |
| 4,109,922 A * | 8/1978 | Martin | 277/646 |
| 4,163,544 A * | 8/1979 | Fowler et al. | 251/328 |
| 4,551,310 A * | 11/1985 | Imada et al. | 422/186.05 |
| 4,831,212 A | 5/1989 | Ogata et al. | |
| 5,368,648 A * | 11/1994 | Sekizuka | 118/733 |
| 5,722,668 A * | 3/1998 | Rice et al. | 277/650 |
| 5,746,434 A * | 5/1998 | Boyd et al. | 277/312 |
| 5,805,408 A | 9/1998 | Maraschin et al. | |
| 6,056,267 A * | 5/2000 | Schneider | 251/204 |
| 6,073,576 A | 6/2000 | Moslehi et al. | |
| 6,074,519 A * | 6/2000 | Lee et al. | 156/345.47 |
| 6,083,566 A * | 7/2000 | Whitesell | 427/445 |
| 6,089,543 A | 7/2000 | Freerks | |
| 6,135,460 A * | 10/2000 | Wise et al. | 277/628 |
| 6,390,145 B1 * | 5/2002 | Okabe et al. | 141/1 |

(Continued)

FOREIGN PATENT DOCUMENTS

WO 2007094228 8/2007

*Primary Examiner* — James Keenan
(74) *Attorney, Agent, or Firm* — Renner, Otto, Boisselle & Sklar, LLP

(57) ABSTRACT

A process chamber 10 comprising a container (12), a lid (14), and a sealed interface (16) therebetween. The container's interface surface (30) and/or the lid's interface surface (32) includes at least one groove (36) in which a seal (40) is situated. The seal (40) comprises an elastomeric element (50) and a metallic element (60). The elastomeric element (50) and the metallic element (60) can be arranged and adapted to seal the chamber's interface (16) sequentially during its conversion to a sealed condition. And/or the elastomeric element (50) and the metallic element (60) can be arranged and adapted to seal the chamber's interface in series once the lid (14) is in its sealed condition.

16 Claims, 10 Drawing Sheets

U.S. PATENT DOCUMENTS

| | | |
|---|---|---|
| 6,413,800 B1 | 7/2002 | Kyle |
| 6,475,336 B1 | 11/2002 | Hubacek |
| 6,764,265 B2 * | 7/2004 | Kunze et al. ............... 414/217.1 |
| 6,764,386 B2 | 7/2004 | Uziel |
| 6,932,354 B2 | 8/2005 | Kane et al. |
| 2003/0134574 A1 | 7/2003 | Uziel |
| 2004/0200736 A1 | 10/2004 | Van Heerden et al. |
| 2005/0263878 A1 | 12/2005 | Potter |

* cited by examiner

SEMICONDUCTOR PROCESS CHAMBER

RELATED APPLICATIONS

This application is related to U.S. Provisional Patent Application No. 60/887,630 filed on Feb. 1, 2007, U.S. Provisional Patent Application No. 60/908,217 filed on Mar. 27, 2007, and U.S. Provisional Patent Application No. 60/949,657 filed on Jul. 13, 2007. The entire disclosures of these earlier provisional applications are hereby incorporated by reference.

BACKGROUND

A semiconductor process chamber commonly comprises a container, a lid, and a seal that seals the interface therebetween. The lid is usually convertible between a condition whereat it seals the access opening into the processing space, and a condition whereat the access opening is uncovered for loading/unloading of the processing space. The container's interface surface and/or the lid's interface surface can include a circumferential groove in which the seal is situated.

Many semiconductor manufacturing methods now require processing chambers to create ultra-high-vacuum (UHV—pressures lower than about $10^{-7}$ pascal and/or $10^{-9}$ torr) and/or ultra-high-purity (UHP—total maximum contaminant level of 10 ppm) environments. And these manufacturing methods can involve repeated opening and sealing process chambers so that substrates (e.g., wafers) can be continuously loaded, processed, and then unloaded therefrom. Slow production rates (e.g., caused by long pump-down times), significant equipment downtime (e.g., for seal replacement or interface cleaning) and/or substandard yields (e.g., due to particle generation) are generally used as undesirable by semiconductor manufacturers.

SUMMARY

A seal comprises an elastomeric element and a metallic element that can seal the container-lid interface of a process chamber. The seal can be constructed to achieve ultra high vacuum levels without compromising on cleanliness, and still allow a clamped (rather than bolted) container-lid interface. Thus, the seal can efficiently be used in UHV and/or UHP processing chambers with unbolted and/or dynamic interfaces.

The elastomeric element and the metallic element can be arranged and adapted to seal the chamber's interface sequentially during its conversion to a sealed condition. The elastomeric element creates a seal during early evacuation stages, with the help of a clamping device. This maintains the chamber's vacuum, so that pressure differential can continue to rise, and provide the sealing load necessary for the metallic element to create a seal. In this manner, the composite seal capitalizes on the low-sealing-load ability of elastomeric element, while still providing a metallic seal during high pressure differential periods.

The elastomeric element and the metallic element can be arranged and adapted to seal the chamber's interface in series when processing chamber is in its sealed condition. The metallic element can be positioned upstream of the elastomeric element relative to the processing chamber. (In cylindrical processing chambers, for example, the metallic element can be positioned radially inward of the elastomeric element.) In this manner, the metallic element shields the elastomeric element from gas permeation, thermal exposure, and reactive plasmas, and/or ion-impingement. The metallic element can also shield the processing chamber from particles generated by the elastomeric element. In this manner, the disadvantages often associated with elastomeric seals (e.g., gas-permeation bulk, reactive degrade, thermal-exposure deterioration, shortened life span, impure-particle generation, electrical-discontinuity causation, etc.) are eliminated or at least minimized.

DRAWINGS

FIGS. 2A-2D, 3A-3D, 4A-4D, 5A-5D, 6A-6D, 7A-7D, and 8A-8D are $2^{nd}$-$8^{th}$ drawing sets showing the seal's contact with, and compression by, interfacing surfaces of the lid and container.

Figure 7A:
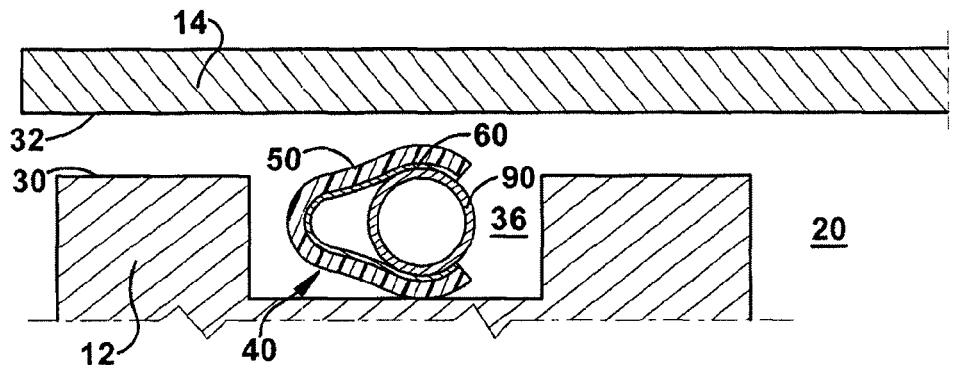
Figure 7B:
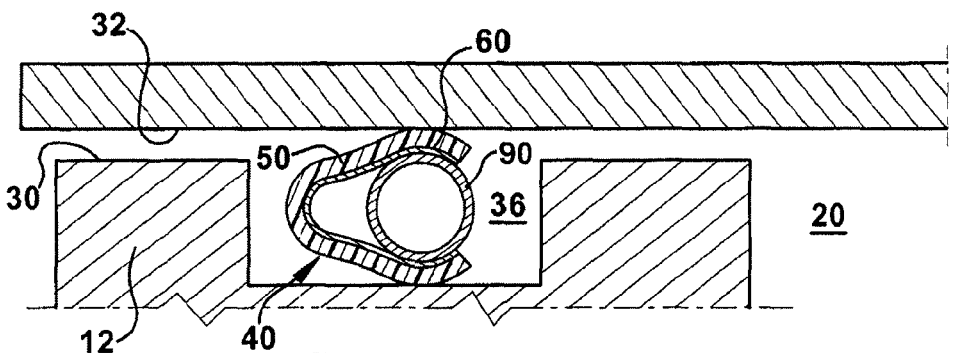
Figure 7C:
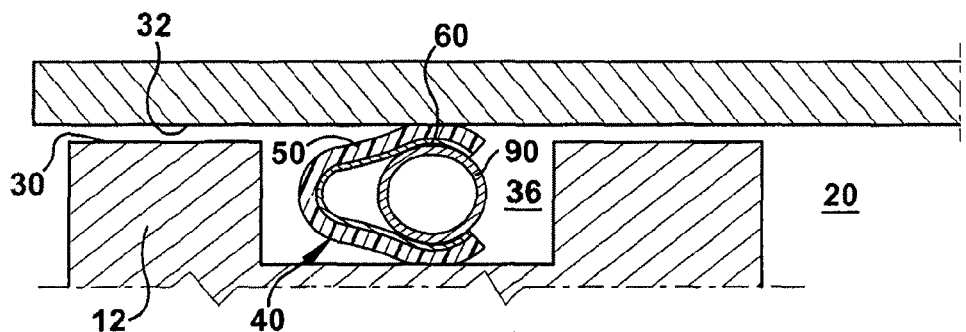
Figure 7D:
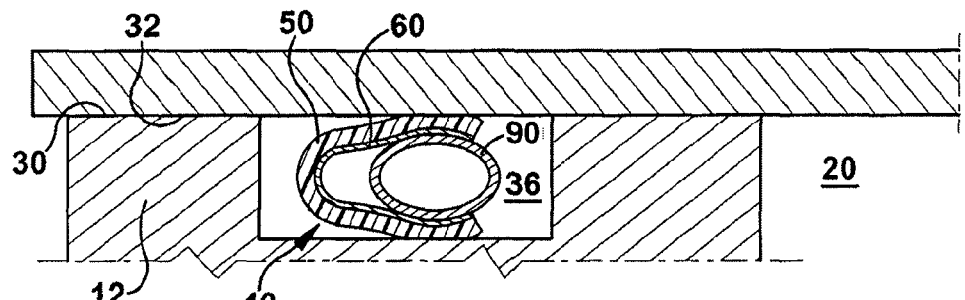
Figure 7E:
Figure 7F:
Figure 8A:
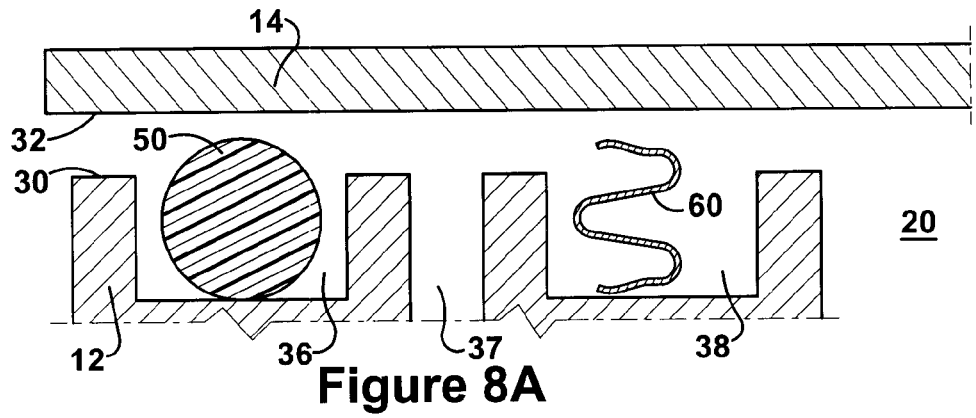
Figure 8B:
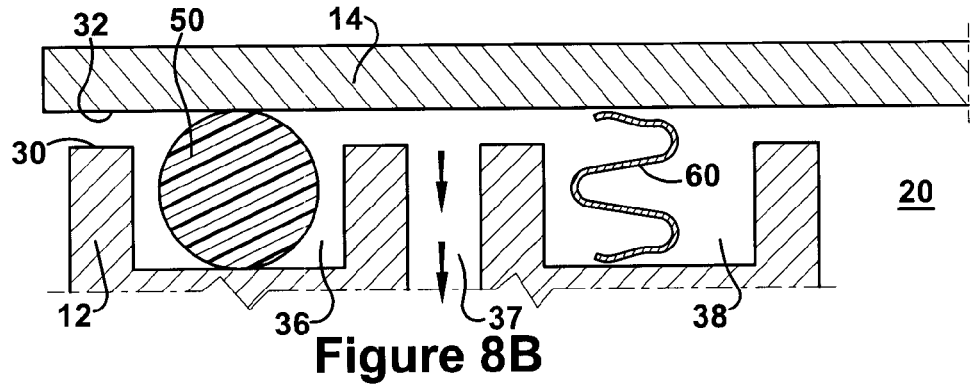
Figure 8C:
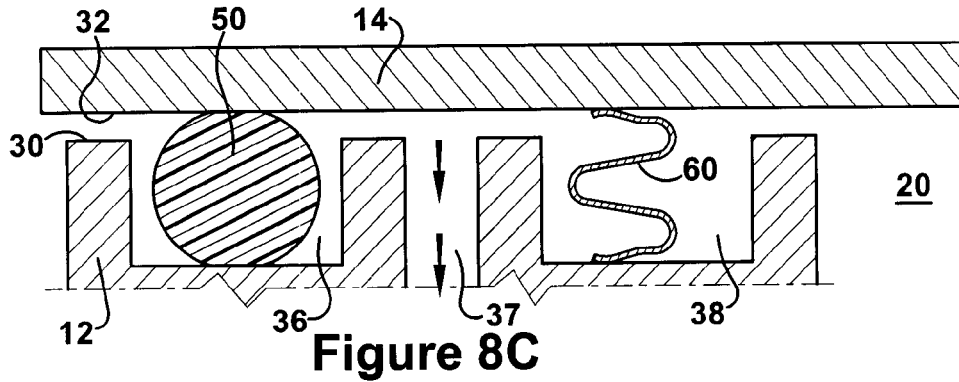
Figure 8D:
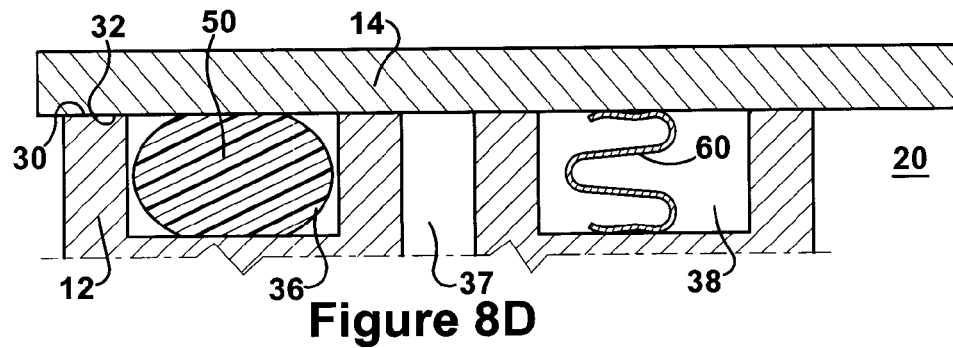

FIGS. 7E and 7F show two possible forms a spring which can be used with the seal shown in FIGS. 7A-7D.

DESCRIPTION

Figure 1A:
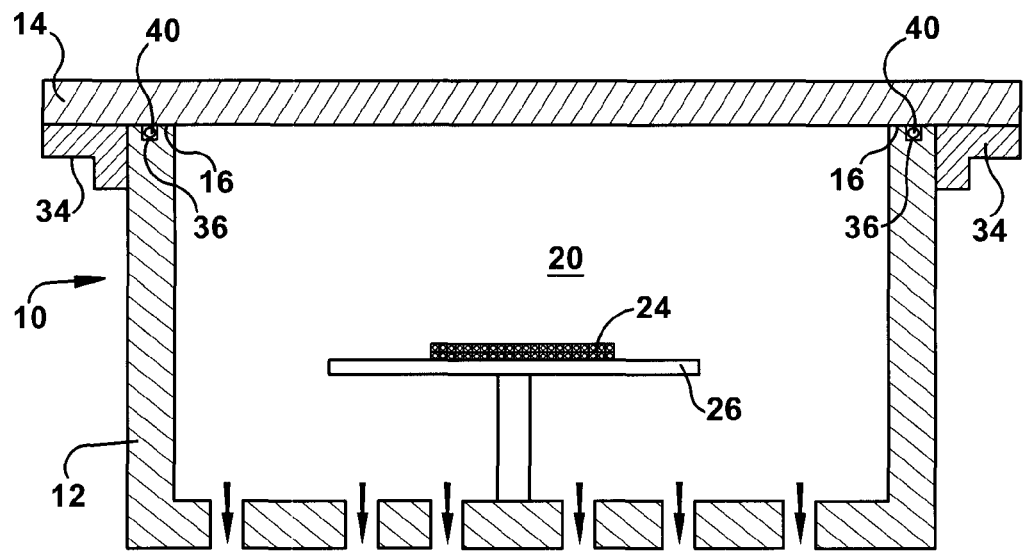
FIG. 1A is a schematic view of a process chamber comprising a container and a lid, the lid being shown in its sealed condition.
Figure 1B:
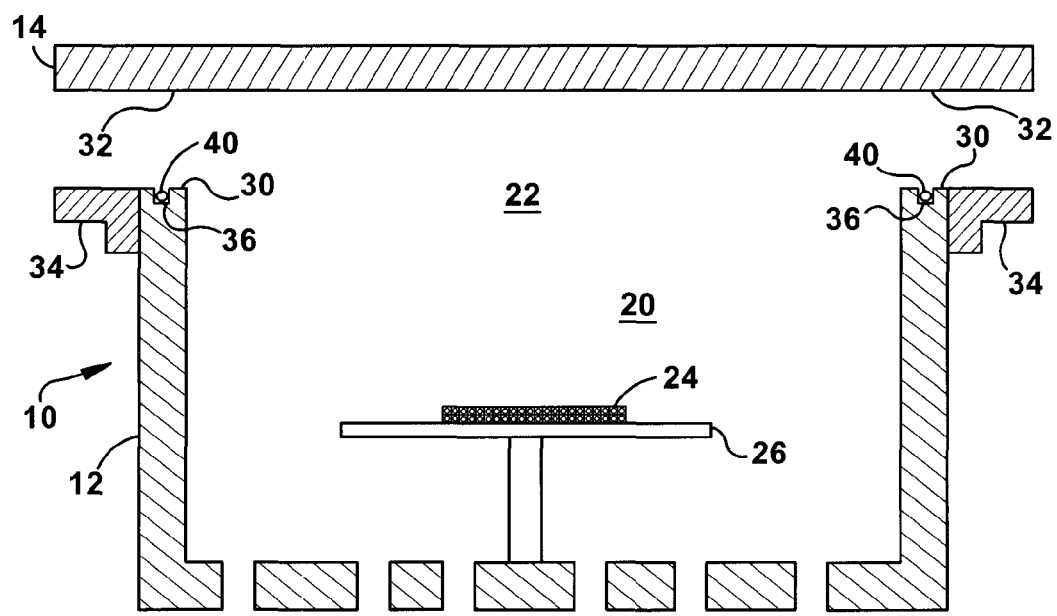
FIG. 1B is a schematic view of a process chamber comprising a container and a lid, the lid being shown in its load/unload condition.

Referring now to the drawings, and initially to FIGS. 1A and 1B, a process chamber 10 comprises a container 12, a lid 14, and an interface 16 therebetween. The container 12 defines a processing space 20 (and an access opening 22 thereinto). The lid 14 is convertible between a sealed condition (FIG. 1A), whereat it seals the access opening 22 into the processing space 20, and a loading/unloading condition (FIG. 1B), whereat the access opening 22 is uncovered.

The process chamber 10 can be an ultra-high-vacuum (UHV) and/or ultra-high-purity (UHP) chamber which is part of a semiconductor manufacturing process. When the lid 14 is in its load-unload condition, the substrate 24 (e.g., a wafer) can be inserted through the access opening 22 into the processing space 20 and staged on the pedestal 26. Once the lid 14 is converted to its sealed condition, the interface 16 is sealed, the substrate 24 can be processed within the container 12. The processing can comprise photo-masking, deposition, oxidation, nitridation, ion implantation, diffusion, and/or etching. After the wafer-processing step, the vacuum can be released within the processing space 20, and the lid can be converted from its sealed condition to its load-unload condition. The substrate 24 can be withdrawn from the processing space 20 (through the access opening 22) and the steps repeated for the next substrate (e.g., the next wafer in the processing line).

The container 12 includes an interface surface 30 surrounding the access opening 22 and the lid 14 includes an interface surface 32 seated against the container's interface surface 30 when in its sealed condition. These surfaces 30/32 together define the interface 16 between the container 12 and the lid 14. A clamp 34 (or other suitable means) can be provided to brace, lock, or otherwise hold the lid 14 against the container 12.

Figure 1C:
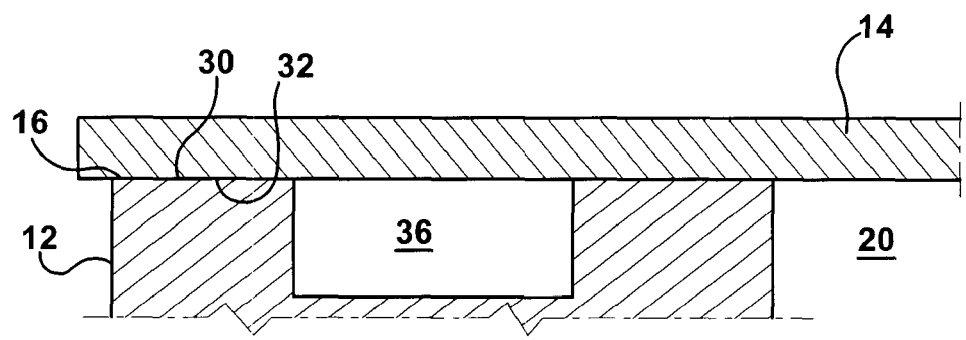
FIG. 1C is a close-up of a groove in the container-lid interface, the groove having a rectangular cross-section shape.
Figure 1D:
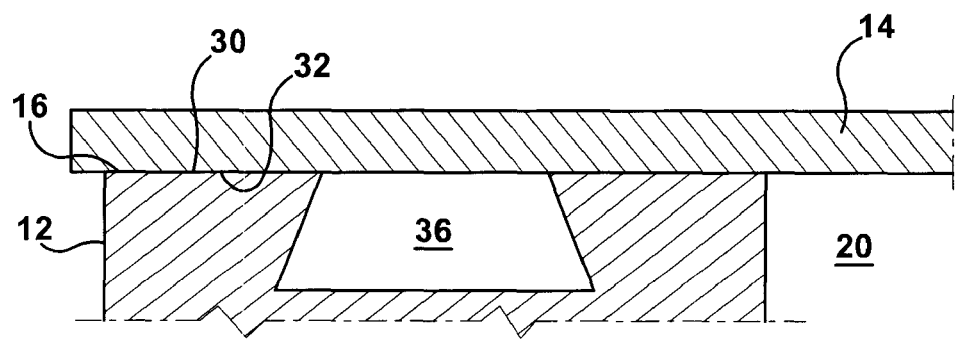
FIG. 1D is a close-up of a groove in the container-lid interface, the groove, having a trapezoidal cross-section shape.
Figure 2A:
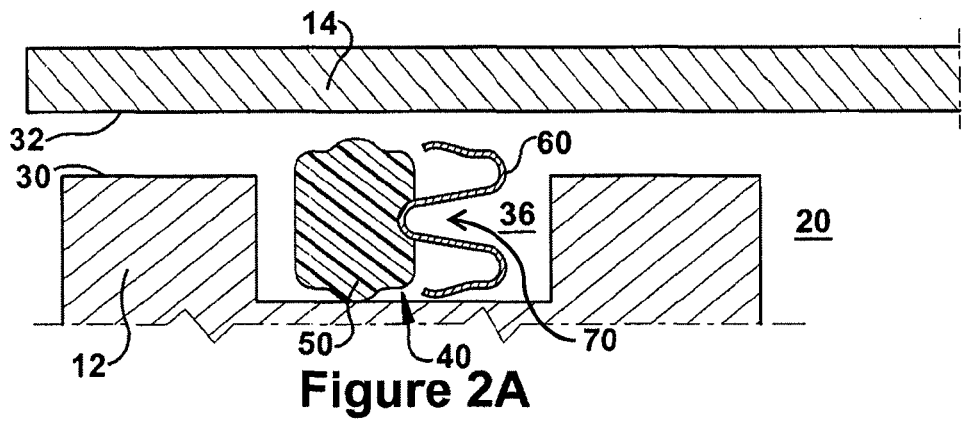
Figure 2B:
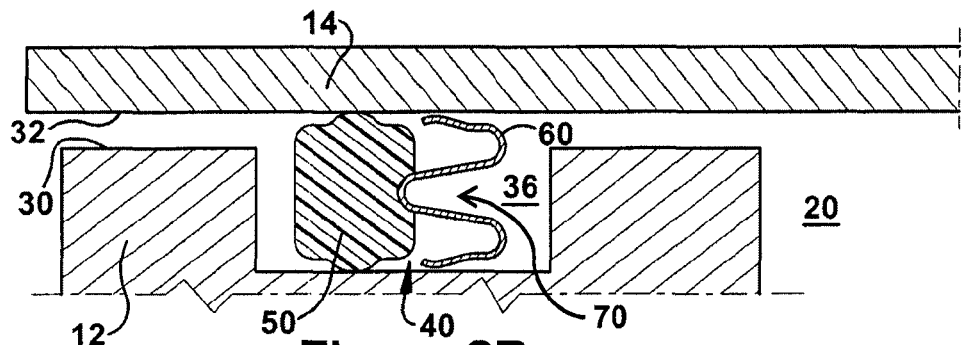
Figure 2C:
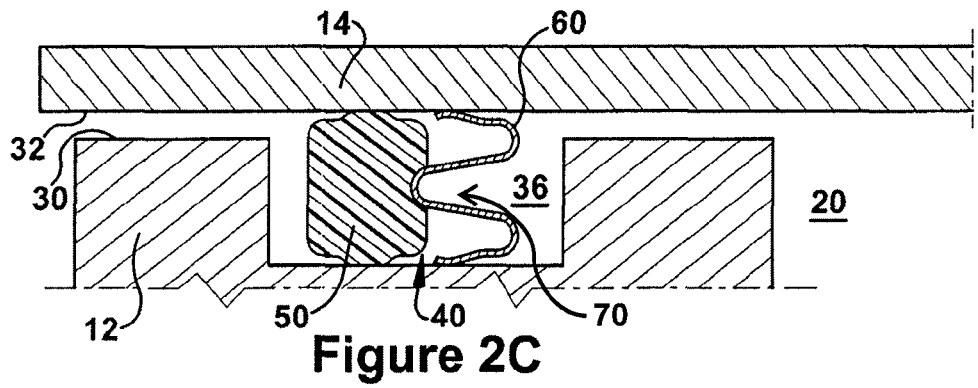
Figure 2D:
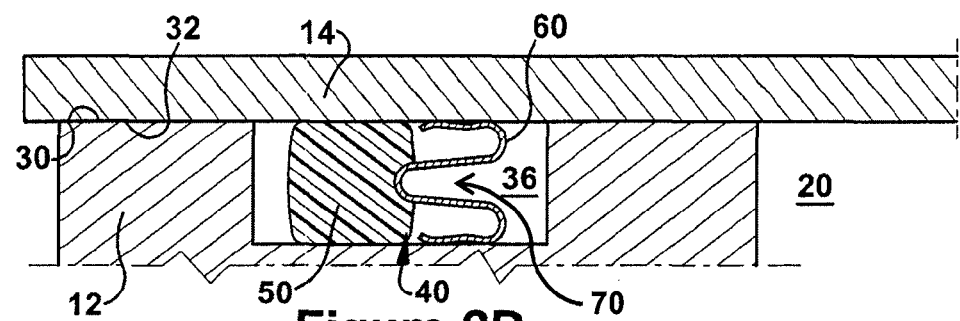
Figure 3A:
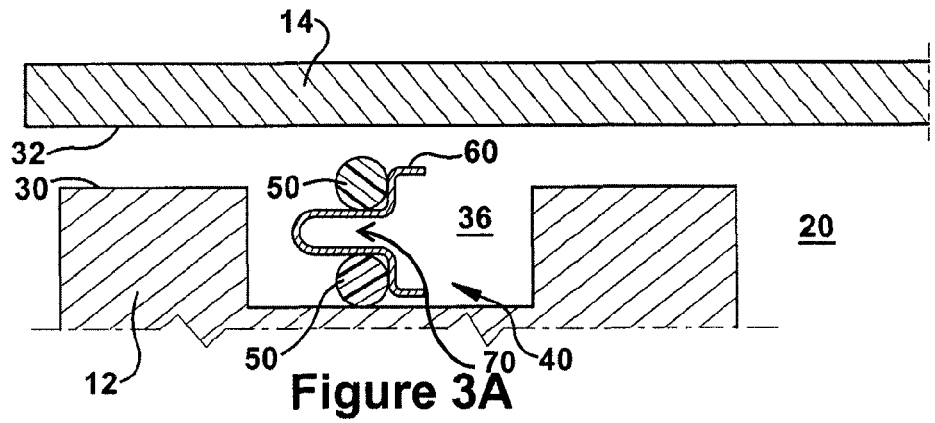
Figure 3B:
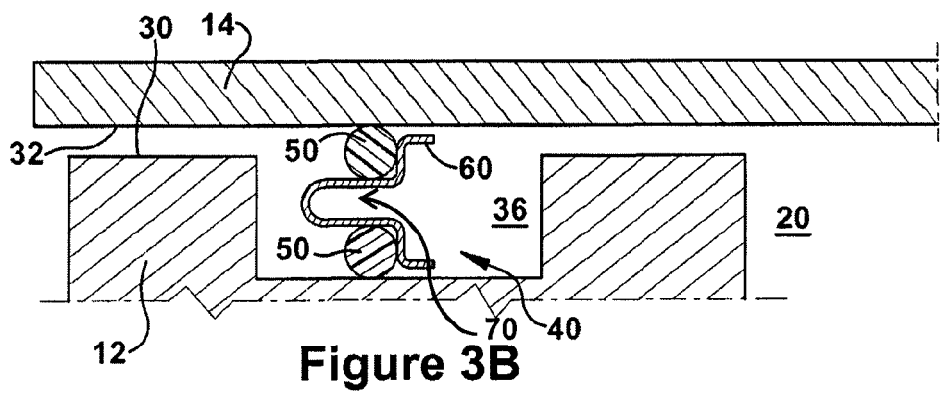
Figure 3C:
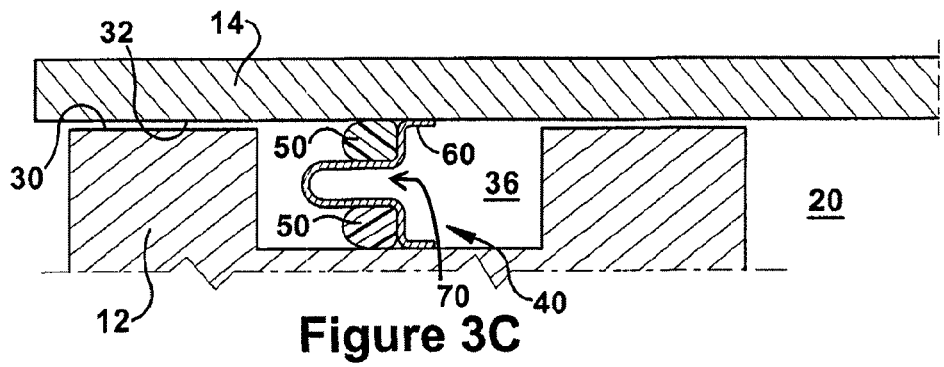
Figure 3D:
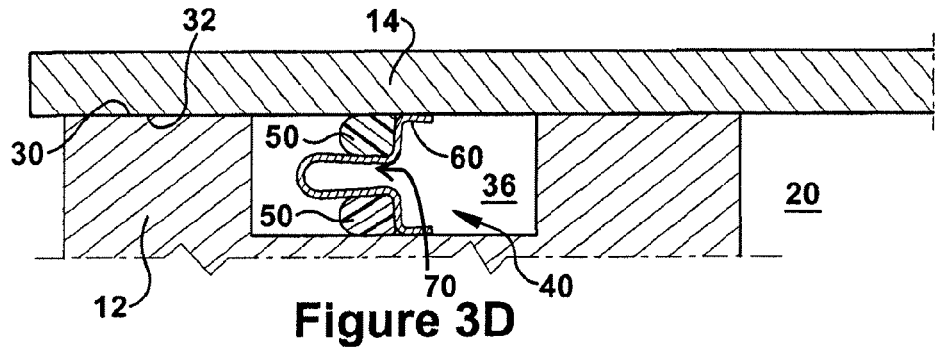
Figure 4A:
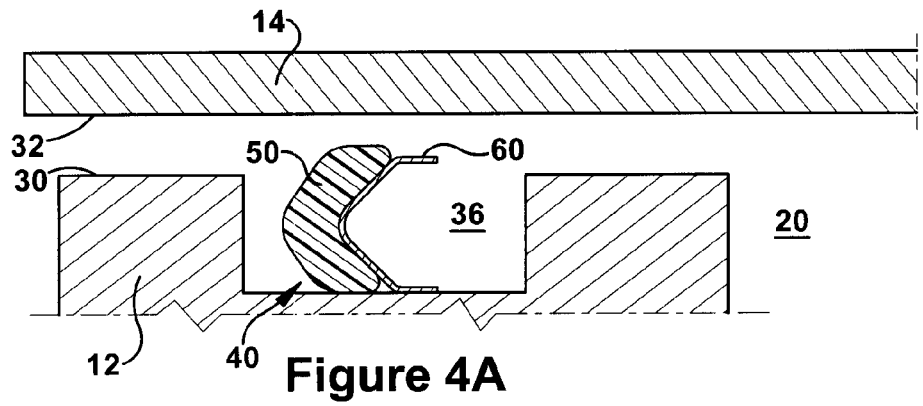
Figure 4B:
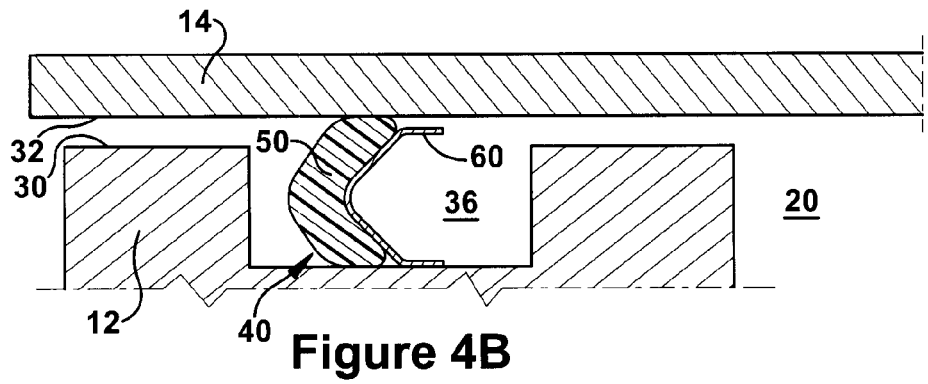
Figure 4C:
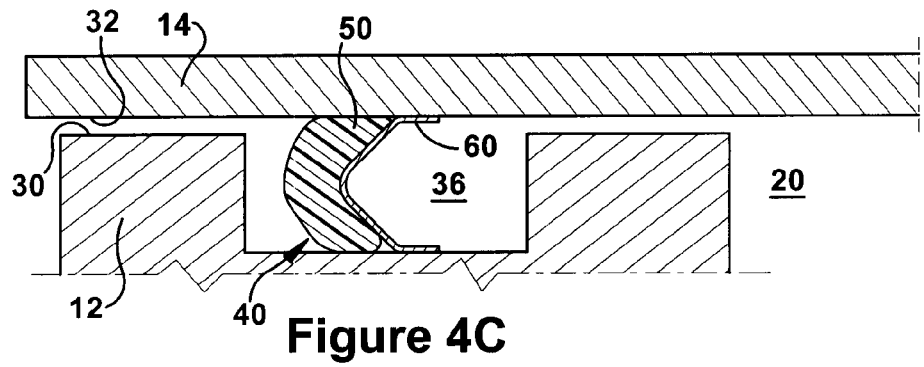
Figure 4D:
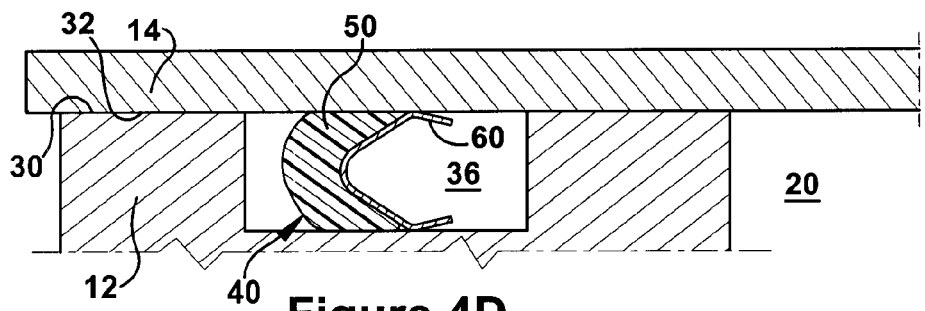
Figure 5A:
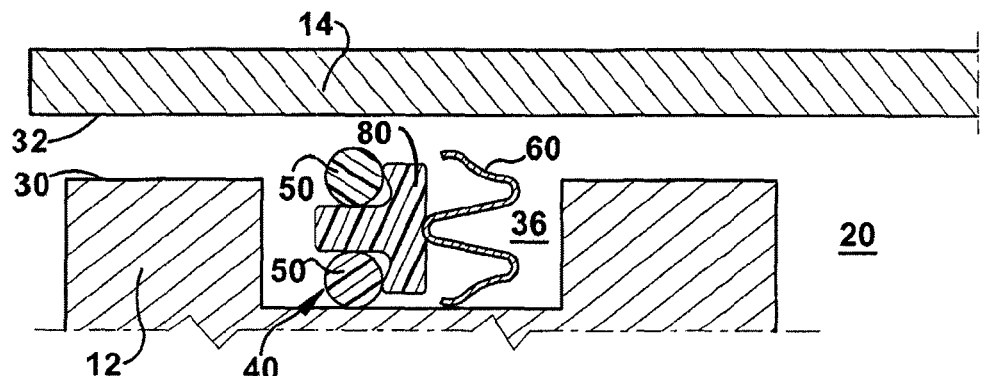
Figure 5B:
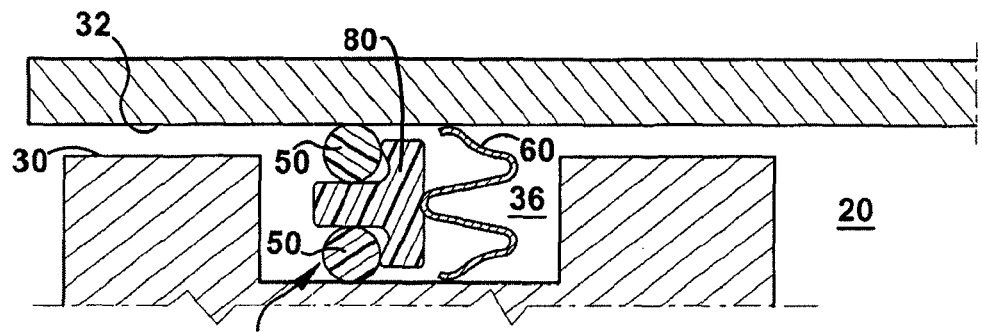
Figure 5C:
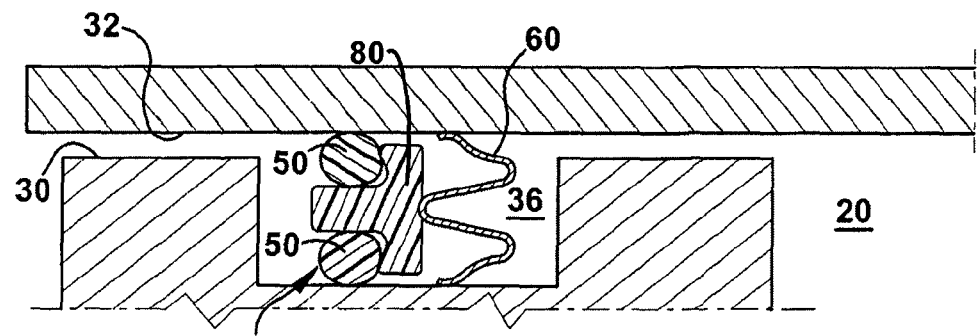
Figure 5D:
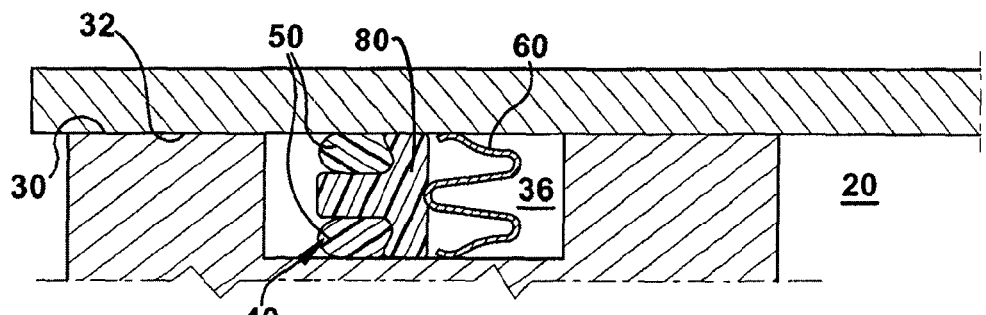
Figure 6A:
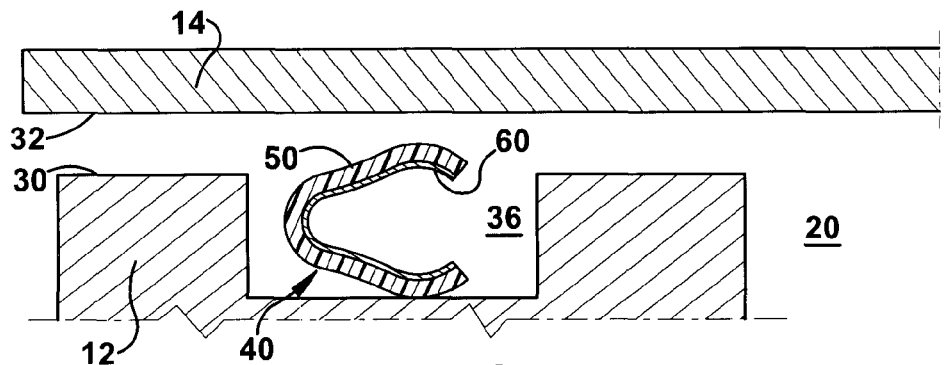
Figure 6B:
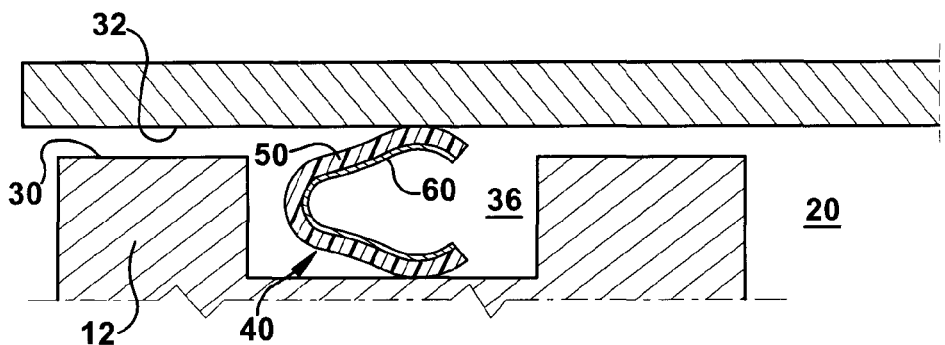
Figure 6C:
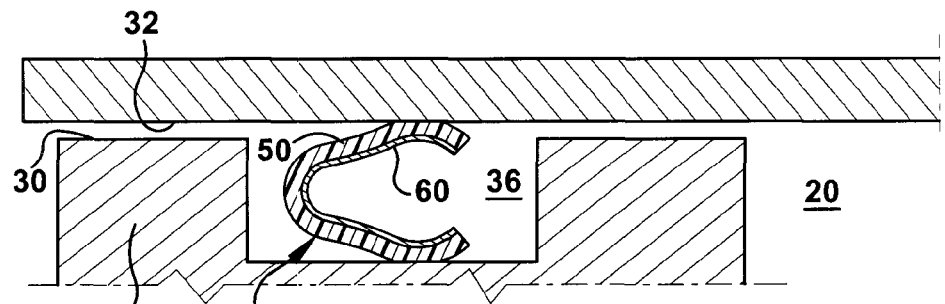
Figure 6D:
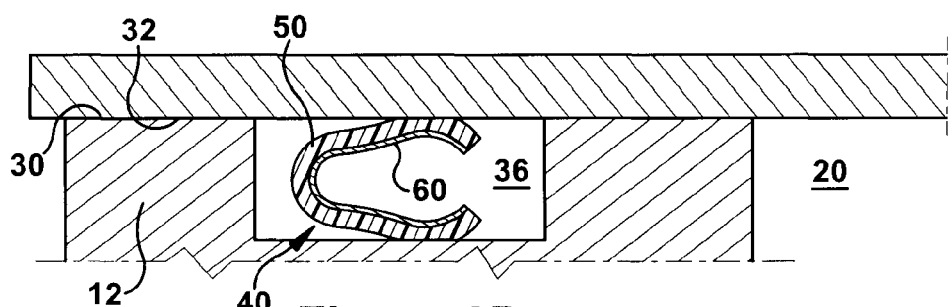

The container's interface surface 30 and/or the lid's interface surface 32 includes at least one groove 36. In many of the illustrated embodiments, the grooves 36 have a rectangular cross-sectional shapes. But, the groove 36 can have such a rectangular cross-section shape (FIG. 1C), a trapezoidal cross-section shape (FIG. 1D), or any other suitable cross-section shape. The groove 36 is continuous around the rim (e.g, perimeter, circumference) surrounding the processing chamber 20 and/or the access opening 22.

As is best seen by referring additionally to the $2^{nd}$-$7^{th}$ drawing sets, a seal 40 is situated in the groove 36. The seal 40 has a generally ring-like shape, so as to be seated in the continuous groove 36.

The seal 40 can generally comprises an elastomeric element 50 and a metallic element 60. The elastomeric element 50 can be made from polymeric materials including nylon, polytetrafluoroethylene, fluorinated ethylene-propylene, chlorotrifluoroethylene, perfluoroalkoxy polymer, polyvinyls, polyethylene, polypropylene, polystyrene, polysulfone and the like. The metallic element 60 can be made from aluminum, steel, stainless steel, copper, brass, titanium, nickel, and alloys thereof.

The elastomeric element 50 and the metallic element 60 can be arranged and adapted to seal the chamber's interface 16 sequentially during conversion to the sealed condition. Specifically, for example, the seal 40 can be designed so that the uncompressed height $h_1$ of the elastomeric element 50 is greater than the uncompressed height $h_2$ of the metallic element 60. (See A figures in $2^{nd}$-$7^{th}$ drawing sets.) This height difference can result in the elastomeric element 50 being contacted and compressed prior to contact-compression of the metallic element 60.

When converting the lid 14 to the sealed condition, the elastomeric element 50 is first contacted by the lid 14 (See B figures in $2^{nd}$-$7^{th}$ drawing sets). Thereafter, possibly with the help of the clamp 34, the elastomeric element 50 is compressed. (See C figures in $2^{nd}$-$7^{th}$ drawing sets.) The clamp 34 need only be sufficient to compress the elastomeric element 50 (not the metallic element 60), whereby an easily removable, and/or manually operable, clamping arrangement can be used. The elastomeric element 50 creates a seal during early evacuation stages, thereby allowing the vacuum to continue to build in the processing chamber 20. As the pressure differential rises, it creates a sealing load sufficient to compress the metallic element 60. (See D figures in $2^{nd}$-$7^{th}$ drawing sets.)

The elastomeric element 50 and the metallic element 60 can be arranged and adapted to seal the chamber's interface 16 in series when processing chamber 20 is in a sealed condition. And the metallic element 60 can be situated to encounter processing activity upstream of the elastomeric element 50. In the illustrated embodiment, this upstream-orientation results in the metallic element 60 being positioned radially inward from the elastomeric element 50. In any event, the metallic element 60 (which can be made of a material impervious to gas within the processing space 20) functions as a shield to protect the elastomeric element 50 from gas permeation. The metallic element 60 also shields the elastomeric element 50 from direct impingement of high energy or ions. In some cases, the metallic element 60 can also function to energize the elastomeric element 50.

Referring particularly to FIGS. 2A-2D, the elastomeric member 50 can have a roughly rectangular cross-section shape with its groove-ceiling side and/or its groove-floor side having a snubbed profile. The metallic element 60 can have a W-like cross-section shape, with ceiling-floor arms which reach towards the elastomeric element 50 and middle arms which extend the opposite direction. The middle arms form a central compression cavity 70 opening towards the processing space 20. The metal-contacting portion of the elastomeric element 50 can have a recess for receiving the central curve of the W.

When the lid 14 is in its loading/unloading condition, the seal's elastomeric member 50 and its metallic element 60 can each be in an uncompressed condition. The height $h_e$ of the elastomeric member will 50 will represent its uncompressed height $h_1$ and the height $h_m$ of the metallic member 60 will represent its uncompressed height $h_2$. If $h_1$ and $h_2$ are greater than the groove's height $h_g$, they will project beyond the groove's ceiling plane. (See FIG. 2A.) As the lid 14 is moved towards its sealed condition, the container-lid gap decreases.

The lid's interfacing surface 32 will first contact the elastomeric member 50. (See FIG. 2B.) The process chamber 10 can (or cannot) be designed so that this first-seal-contact condition is accomplishable manually with the clamp 34. In any event, this allows a vacuum to build within the processing chamber 20 thereby further pulling the lid 14 towards the container's interfacing surface 30. As the container-lid gap decreases, the elastomeric member 50 is compressed and the metallic element 60 is contacted. (See FIG. 2C.) As the evacuation of the processing space 20 continues, and the container-lid gap closes, the elastomeric element 50 is further compressed until its height $h_e$ corresponds to the groove's height $h_g$. The now-contacted metallic member 60 is also compressed until its height $h_m$ corresponds to the groove's height he. (See FIG. 2D.) When the lid 14 is in its sealed condition (FIG. 2D), the metallic element 60 forms a radial shield around the inner circumference of the elastomeric element 50.

As shown in FIGS. 3A-3D, the seal 40 can comprise two elastomeric elements 50 which, for example, each have a circular cross-section. The metallic element 60 has a flanged-omega cross-sectional shape with a central compression cavity opening and a pair of ceiling-floor arms. The central compression cavity 70 opens towards the processing space 20 and the elastomeric elements 50 are positioned on either side thereof. In the completely compressed state (FIG. 3D), the metallic element 60 forms a radially inward shield for the elastomeric elements 50.

As shown in FIGS. 4A-4D, the elastomeric elements 50 are compressed before the metallic element 60 and, when the lid 14 is in its sealed condition (FIG. 3D), the metallic element 60 forms a shield in front of the elastomeric elements 50. (In this embodiment, the height $h_e$ is measured from the bottom of the lower elastomeric member 50 to the top of the upper elastomeric member 50.)

As shown in FIGS. 5A-5D, the seal 40 can comprise two elastomeric elements 50, a W-shape metallic element 60, and a retainer element 80. The elastomeric elements 50 can each have, for example, a circular cross-section shape in non-compressed state, and the retainer element 80 can have a T cross-section shape. The elastomeric elements 50 are positioned on the groove-ceiling side and the groove-floor side of the retainer element 80, on either side of the T's stem. The metallic element 60 is positioned adjacent the T's head, with the central curve of the W seating on the retainer member 80. The retainer element 80 (which can be made of aluminum or any other suitable material) does not necessarily compress during the sealing steps, but rather retains the other components during their compression. In this embodiment, both the metallic element 60 and the retainer element 80 shield the elastomeric elements 50 from processing effects.

As shown in FIGS. 6A-6D, the elastomeric element 50 and the metallic element 60 can have similar cross-sectional shapes, such as the illustrated cut-off-tear-drop cross-sectional shape. The elastomeric element 50 can straddle downstream side of the metallic element 60 and it can be bonded thereto (or a completely separate piece). The metallic element 60 can have a central compression cavity opening towards the processing space. The elastomeric element 50 will compress prior to the metallic element 60 during sealing steps. And although upstream ceiling-floor portions of the elastomeric element 50 may be exposed to processing steps, the metallic element 60 will shield the rest of the element 50 therefrom.

As shown in FIGS. 7A-7D, the seal 40 can further include an energizing element 90 such as a coiled spring (FIG. 7E) or a cut tube (FIG. 7F). If the energizing element 90 occupies a radially inward portion of the seal 40, it can also be made of a metallic or other gas impervious material. A radially-inward element 90 can aid the metallic element 60 in shielding the elastomeric element 50.

In the $2^{nd}$ through $7^{th}$ drawing sets, the elastomeric element 50 and the metallic element 60 were shown positioned within the same groove 36. As shown in FIGS. 8A-8D, separate groove-situating is also possible. For example, the container's interface surface 30 and/or the lid's interface surface 32 can have two grooves 36 and 38 concentrically arranged relative to the processing space 20. In this case, the elastomeric element 50 (which can have a circular cross-section shape) is positioned in the groove most remote from the processing space 20 and the metallic element 60 (which can have a W cross-section shape) is positioned in the closer groove.

In the two-groove design shown in the $8^{th}$ drawing set, the container 12 can further comprise an evacuation conduit 37 between the two grooves 36 and 38, which is sealed upon As was indicated above, the metallic element 60 can function as a shield to protect the elastomeric element 50 from gas permeation, ion impingement, chemically corrosive vapors, and other life-shortening enemies. That being said, the elastomeric member 50 may need replacement before, and/or more often, than the metallic element 60. In many designs (see e.g., the seal 40 in the $2^{nd}$-$5^{th\ and}$ $8^{th}$ drawing sets) the elastomeric element 50 can be replaced, with or without replacement of the metallic member 60.

The seal 40 can be designed by optimizing parameters including the stiffness value of the elastomeric element 50, the stiffness value of the metallic element 60, the uncompressed height $h_1$ of the elastomeric element, the uncompressed height $h_2$ of the metallic element 60, and the initial gap distance g between the interfacing surfaces. The optimizing step can comprise, for example, finite element analysis (FEA).

Although the processing chamber 20, the seal 40, the elastomeric element 50, the metallic element 60, and/or associated methods have been shown and described with respect to certain embodiments, it is obvious that equivalent alterations and modifications will occur to others skilled in the art. In regard to the various functions performed by the above described elements (e.g., components, assemblies, systems, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A process chamber comprising a container, a lid, and a seal which seals an interface between the container and the lid; wherein:

the container defines a processing space and an access opening into this processing space;

the lid is convertible between a sealed condition, whereat it seals the access opening into the processing space, and a loading/unloading condition, whereat the access opening is uncovered for insertion/withdrawal of a substrate;

the container includes an interface surface surrounding the access opening and the lid includes an interface surface seated against the container's interface surface when in its sealed condition;

the container's interface surface and/or the lid's interface surface includes at least one groove in which the seal is situated; and the seal comprises an elastomeric element and a metallic element arranged to seal the interface in series, the metallic element being situated to encounter processing activity upstream of the elastomeric element relative to the processing space, wherein the metallic element comprises a pair of arm portions, one arm portion for contacting the ceiling of the groove and the other arm portion for contacting the floor of the groove, and an energizing portion interconnecting the arm portions.

2. A process chamber as set forth in claim 1, wherein the elastomeric element has an uncompressed height $h_1$ and the metallic element has an uncompressed height $h_2$ and wherein $h_1$ is greater than $h_2$.

3. A process chamber as set forth in claim 2, wherein the metallic element is interposed between the elastomeric element and the process space.

4. A process chamber as set forth in claim 1, wherein the metallic element is interposed between the elastomeric element and the process space.

5. A process chamber as set forth in claim 1, wherein the elastomeric element compresses 20% to 30% of its uncompressed height $h_1$.

6. A process chamber as set forth in claim 1, wherein the elastomeric member has a roughly rectangular cross-sectional shape.

7. A process chamber as set forth in claim 1, wherein the upstream side of the elastomeric member relative to the processing space has a recess for receiving a portion of the metallic element.

8. A process chamber as set forth in claim 1, wherein the metallic element comprises a central compression cavity opening towards the processing space.

9. A process chamber as set forth in claim 1, wherein the arm portions are parallel.

10. A process chamber as set forth in claim 1, wherein the seal comprises two elastomeric elements situated in the same groove as the metallic element.

11. A process chamber as set forth in claim 1, further comprising a retainer element.

12. A process chamber as set forth in claim 1, wherein the elastomeric element straddles the downstream side of the metallic element.

13. A process chamber as set forth in claim 1, wherein the container's interface surface and/or the lid's interface surface includes two grooves concentrically arranged relative to the processing space;

wherein the metallic element is situated in the groove closest to the processing space and the elastomeric element is situated in the groove remote from the processing space.

14. A method of processing a substrate in the process chamber set forth in claim 1, said method comprising the steps of:

inserting the substrate through the access opening into the processing space when the lid is in its opened condition;

aligning the lid's interface surface with the container's interface surface; and converting the lid to its sealed condition, wherein said converting step comprises evacuating the processing space and wherein the elastomeric element forms a seal prior to the lid reaching its sealed condition;

processing the substrate within the processing space after which the lid is in its sealed condition;

releasing the vacuum in the processing chamber;

converting the lid from its sealed condition and withdrawing the substrate from the processing space.

15. A process chamber comprising a container, a lid, and a seal which seals an interface between the container and the lid; wherein:

the container defines a processing space and an access opening into this processing space;

the lid is convertible between a sealed condition, whereat it seals the access opening into the processing space, and an opened condition, whereat the access opening is uncovered for the insertion/withdrawal of a substrate;

the container includes an interface surface surrounding the access opening and the lid includes an interface surface seated against the container's interface surface when in its sealed condition;

the container's interface surface and/or the lid's interface surface includes at least one groove in which the seal is situated; and the seal comprises an elastomeric element having an uncompressed height $h_1$ and a metallic element having an uncompressed height $h_2$ that is less than $h_1$, and wherein the metallic element comprises a pair of arm portions, one arm portion for contacting the ceiling of the groove and the other arm portion for contacting the floor of the groove, and an energizing portion interconnecting the arm portions.

16. A process chamber as set forth in claim 15, wherein the pair of arm portions are parallel.

* * * * *